(12) United States Patent
Ha

(10) Patent No.: US 10,153,334 B2
(45) Date of Patent: Dec. 11, 2018

(54) DISPLAY APPARATUS AND METHOD OF MANUFACTURING THE SAME

(71) Applicant: Samsung Display Co., Ltd., Yongin, Gyeonggi-Do (KR)

(72) Inventor: Sangkwon Ha, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/142,698

(22) Filed: Apr. 29, 2016

(65) Prior Publication Data

US 2017/0077202 A1 Mar. 16, 2017

(30) Foreign Application Priority Data

Sep. 10, 2015 (KR) .................. 10-2015-0128561

(51) Int. Cl.
*H01L 27/32* (2006.01)
*H01L 29/66* (2006.01)
*H01L 29/786* (2006.01)

(52) U.S. Cl.
CPC ...... *H01L 27/3262* (2013.01); *H01L 27/3248* (2013.01); *H01L 27/3258* (2013.01); *H01L 27/3265* (2013.01); *H01L 27/3276* (2013.01); *H01L 29/66757* (2013.01); *H01L 29/78618* (2013.01); *H01L 29/78666* (2013.01); *H01L 29/78675* (2013.01); *H01L 2227/323* (2013.01)

(58) Field of Classification Search
CPC . H01L 21/2026; H01L 21/268; H01L 27/124; H01L 27/1248; H01L 27/1255; H01L 27/3244; H01L 27/3262; H01L 27/3297; H01L 29/66757; H01L 29/78603; H01L 29/78633; H01L 29/78675
USPC .. 257/E21.134, E21.347, E21.413, E29.282, 257/E29.293, E29.295; 438/151, 166, 438/795
See application file for complete search history.

(56) References Cited

U.S. PATENT DOCUMENTS

| 9,136,316 B2 * | 9/2015 | Lee ....................... H01L 27/124 |
| 2002/0024096 A1 * | 2/2002 | Yamazaki ............. H01L 51/524 |
| | | 257/359 |

(Continued)

FOREIGN PATENT DOCUMENTS

| JP | 2008124215 A | 5/2008 |
| JP | 2009176865 A | 8/2009 |

(Continued)

*Primary Examiner* — Edward Chin
(74) *Attorney, Agent, or Firm* — H.C. Park & Associates, PLC

(57) ABSTRACT

A display apparatus includes a substrate having a plurality of pixel areas, and a pixel circuit including a storage capacitor and a plurality of thin film transistors (TFTs) which are disposed in each pixel area. At least one of the plurality of TFTs includes a semiconductor layer disposed on the substrate and including a first ion impurity, a source area and a drain area, which are spaced apart from each other, have a first depth from a surface of the semiconductor layer, and include a second ion impurity, a gate electrode disposed on the semiconductor layer between the source area and the drain area, and a bias wiring electrically connected to the semiconductor layer and disposed adjacent to at least one of the source area and the drain area.

10 Claims, 8 Drawing Sheets

(56) References Cited

U.S. PATENT DOCUMENTS

| | | | |
|---|---|---|---|
| 2004/0053452 A1* | 3/2004 | Hasegawa | H01L 21/2026 438/151 |
| 2005/0092995 A1* | 5/2005 | Yoo | G02F 1/1362 257/72 |
| 2006/0043494 A1 | 3/2006 | Ipposhi et al. | |
| 2009/0050894 A1 | 2/2009 | Park et al. | |
| 2010/0244022 A1 | 9/2010 | Takahashi et al. | |
| 2014/0312320 A1 | 10/2014 | Yang et al. | |
| 2015/0001476 A1 | 1/2015 | Wang | |
| 2015/0097180 A1* | 4/2015 | Yu | H01L 27/14632 257/43 |

FOREIGN PATENT DOCUMENTS

| | | |
|---|---|---|
| KR | 1020050047386 A | 5/2005 |
| KR | 1020060053097 A | 5/2006 |
| KR | 1020140125186 A | 10/2014 |
| KR | 1020150001154 A | 1/2015 |

\* cited by examiner

DISPLAY APPARATUS AND METHOD OF MANUFACTURING THE SAME

CLAIM OF PRIORITY

This application claims the priority of and all the benefits accruing under 35 U.S.C. § 119 of Korean Patent Application No. 10-2015-0128561, filed on Sep. 10, 2015, in the Korean Intellectual Property Office (KIPO), the disclosure of which is incorporated herein in its entirety by reference.

BACKGROUND OF THE INVENTION

1. Field of Disclosure

One or more exemplary embodiments relate to a display apparatus and a method of manufacturing the same.

2. Description of the Related Art

An organic light emitting display apparatus includes two electrodes and an organic light emitting layer arranged between the two electrodes, and emits light when electrons injected into one electrode and holes injected into the other electrode are combined in the organic light emitting layer to generate excitons and when the generated excitons emit energy.

The organic light emitting display apparatus includes a plurality of pixels including an organic light emitting diode (OLED) which is a self-luminous element, and each pixel includes a plurality of thin film transistors (TFTs) and one or more storage capacitors to drive the OLED. Although each TFT generates a driving current, the TFT has a problem in that current leakage occurs.

SUMMARY OF THE INVENTION

One or more exemplary embodiments include a display apparatus and a method of manufacturing the same.

Additional aspects will be set forth in part in the description which follows and, in part, will be apparent from the description, or may be learned by practice of the presented embodiments.

According to one or more exemplary embodiments, a display apparatus may include a substrate having a plurality of pixel areas, and a pixel circuit including a storage capacitor and a plurality of thin film transistors which are disposed in each pixel area, wherein at least one of the plurality of thin film transistors may include a semiconductor layer disposed on the substrate and including a first ion impurity, a source area and a drain area spaced apart from each other, having a first depth from a surface of the semiconductor layer, and including a second ion impurity, a gate electrode disposed on the semiconductor layer between the source area and the drain area, and a bias wiring electrically connected to the semiconductor layer and disposed adjacent to at least one of the source area and the drain area.

According to one or more exemplary embodiments, the first ion impurity and the second ion impurity may be different conductive ion impurities.

According to one or more exemplary embodiments, the first depth may be smaller than a thickness of the semiconductor layer.

According to one or more exemplary embodiments, the display apparatus may further include a signal input electrode connected to one of the source area and the drain area, and a signal output electrode connected to the other one of the source area and the drain area, wherein the bias wiring may be disposed on a same layer as the signal input electrode and the signal output electrode.

According to one or more exemplary embodiments, the bias wiring may be non-overlapping the source area and the drain area.

According to one or more exemplary embodiments, the storage capacitor may include a first electrode, a dielectric layer, and a second electrode, and the first electrode may be disposed on a same layer as the gate electrode and may include a same material as the gate electrode.

According to one or more exemplary embodiments, the first electrode may be the gate electrode of one thin film transistor of the plurality of thin film transistors.

According to one or more exemplary embodiments, the bias wiring may apply a same voltage as a voltage, which is applied to the second electrode, to the semiconductor layer.

According to one or more exemplary embodiments, the semiconductor layer may be disposed on the entire substrate.

According to one or more exemplary embodiments, a manufacturing method of a display apparatus may include forming a semiconductor layer having a first ion impurity, forming a gate electrode on the semiconductor layer, forming a source area and a drain area which are disposed at opposite sides of the gate electrode, have a first depth from a surface of the semiconductor layer, and include a second ion impurity, and forming a bias wiring electrically connected to the semiconductor layer, wherein the forming the source are and the drain area may include doping the semiconductor layer with the second ion impurity by using a first mask and the gate electrode.

According to one or more exemplary embodiments, the semiconductor layer may include a first area to correspond to the gate electrode, a second area and a third area which are disposed at opposite sides of the gate electrode, and a peripheral area to surround the first, second, and third areas. The first mask may cover the peripheral area and may include openings to correspond to the first, second, and third areas.

According to one or more exemplary embodiments, one of the second area and the third area may be the source area, and the other one of the second area and the third area may be the drain area.

According to one or more exemplary embodiments, the formation of the bias wiring may include forming the bias wiring to be connected to the peripheral area.

According to one or more exemplary embodiments, the first depth may be smaller than a thickness of the semiconductor layer.

According to one or more exemplary embodiments, the first ion impurity and the second ion impurity may be different conductive ion impurities.

According to one or more exemplary embodiments, the semiconductor layer may be formed on an entire area of the substrate.

According to one or more exemplary embodiments, the manufacturing method may further include forming a signal input electrode connected to one of the source area and the drain area, and forming a signal output electrode connected to the other one of the source area and the drain area, wherein the bias wiring may be disposed in the same plane as the layer which forms the signal input electrode and the signal output electrode.

According to one or more exemplary embodiments, the manufacturing method may further include forming a storage capacitor including a first electrode, a dielectric layer, and a second electrode, wherein the first electrode may be disposed from same layer as the gate electrode and may include the same material as the gate electrode.

According to one or more exemplary embodiments, the bias wiring may be electrically connected to the second electrode of the storage capacitor.

BRIEF DESCRIPTION OF THE DRAWINGS

These and/or other aspects will become apparent and more readily appreciated from the following description of the exemplary embodiments, taken in conjunction with the accompanying drawings in which.

DETAILED DESCRIPTION OF THE INVENTION

Figure 1:
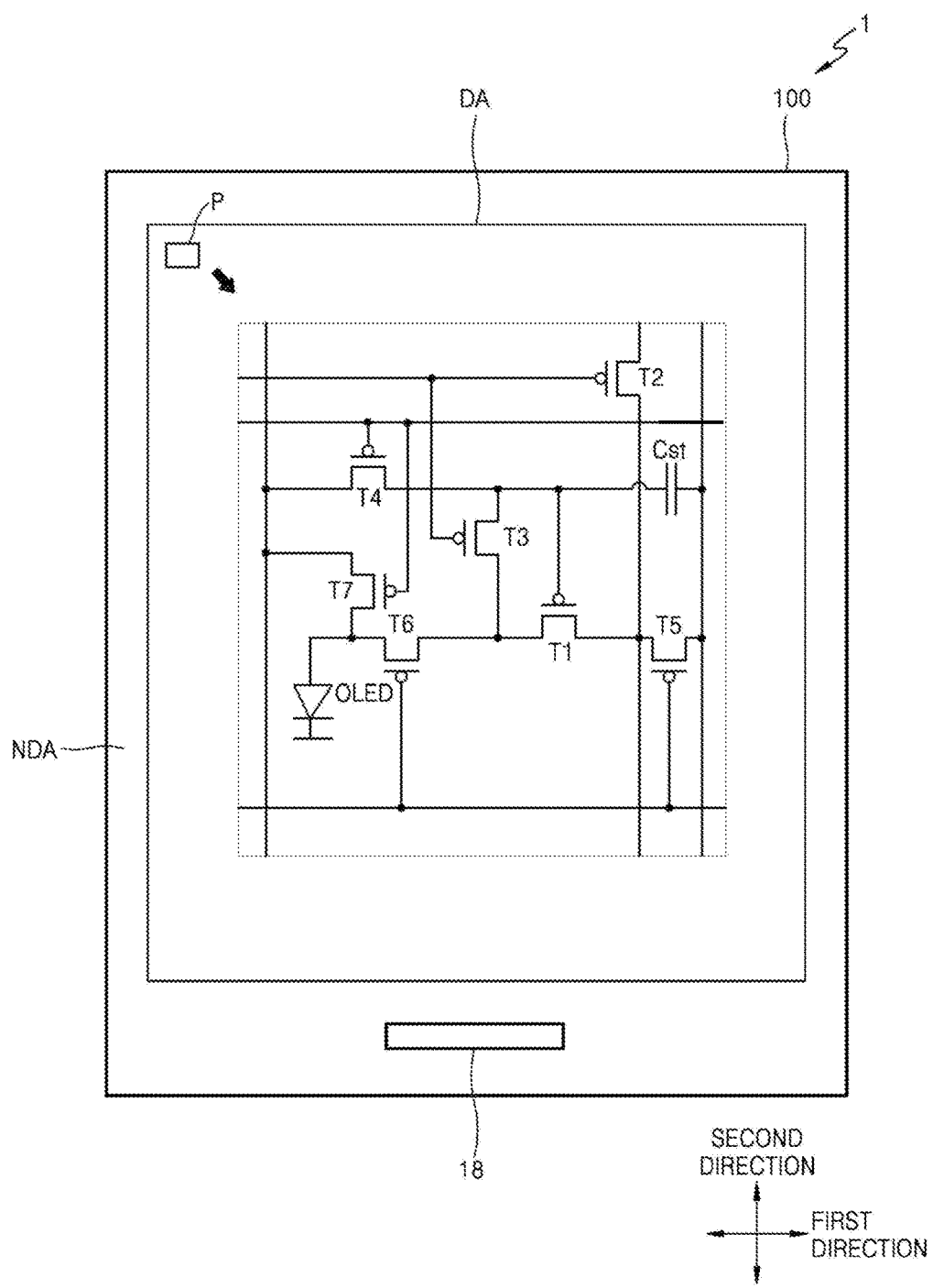
FIG. 1 is a view schematically illustrating a display apparatus fabricated according to an exemplary embodiment of the present inventive concept.

The present exemplary embodiments may have different forms and should not be construed as being limited to the descriptions set forth herein. Accordingly, the exemplary embodiments are merely described below, by referring to the figures, to explain aspects of the present description.

Reference will now be made in detail to exemplary embodiments, examples of which are illustrated in the accompanying drawings, wherein like reference numerals refer to like elements throughout.

It will be understood that although the terms "first", "second", etc. may be used herein to describe various components, these components should not be limited by these terms. These components are only used to distinguish one component from another component.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on," another layer, region, or component, it can be directly or indirectly formed on the other layer, region, or component. That is, for example, intervening layers, regions, or components may be present.

Sizes of elements in the drawings may be exaggerated for convenience of explanation. In other words, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

In exemplary embodiments, when a film, layer, region and component are connected to each other, "connection" may include a direct connection between the film, layer, region, and component and also include an indirectly connection between the film, layer, region, and component through another the film, layer, region, or component. For example, when the present disclosure states that a film, layer, region, and component is electrically connected to each other, the connection may include not only a direct connection between the film, layer, region, and component but also an indirect connection between the film, layer, region, and component though another film, layer, region, or component.

As used herein, the term "and/or" includes any and all combinations of one or more of the associated listed items. Expressions such as "at least one of," when preceding a list of elements, modify the entire list of elements and do not modify the individual elements of the list.

FIG. 1 is a view schematically illustrating a display apparatus 1 according to one exemplary embodiment of the present inventive concept.

Referring to FIG. 1, the display apparatus 1 according to one exemplary embodiment includes a substrate 100 having a display area DA and a non-display area NDA).

The display area DA includes a plurality of pixel areas P to display an image. The pixel area P shown in an enlarged view showing a pixel circuit as indicated by a bold arrow, may include a plurality of thin film transistors T1 though T7 and a storage capacitor Cst. The pixel area P may include a display element, for example, an organic light emitting diode OLED, which receives a driving voltage through the thin film transistors T1 through T7 and the storage capacitor Cst and displays the image.

In one exemplary embodiment, the plurality of thin film transistors T1 through T7 are referred to as a driving thin film transistor T1 and a plurality of switching transistors T2 through T7, which are also referred to as a data transmitting thin film transistor T2, a compensating thin film transistor T3, a first initializing thin film transistor T4, a first light emission control thin film transistor T5, a second light emission control thin film transistor T6, and a second initializing thin film transistor T7.

The non-display area NDA is disposed adjacent to the display area DA. In one exemplary embodiment, the non-display area NDA are disposed to surround the display area DA as illustrated in FIG. 1. In another exemplary embodiment, the non-display area NDA may be disposed on a side of the display area DA. The non-display area NDA may include a pad unit 18.

Although FIG. 1 illustrates seven thin film transistors, the present inventive concept is not limited thereto. In another exemplary embodiment, types of thin film transistors and the number of the thin film transistors may be variable.

Figure 2:
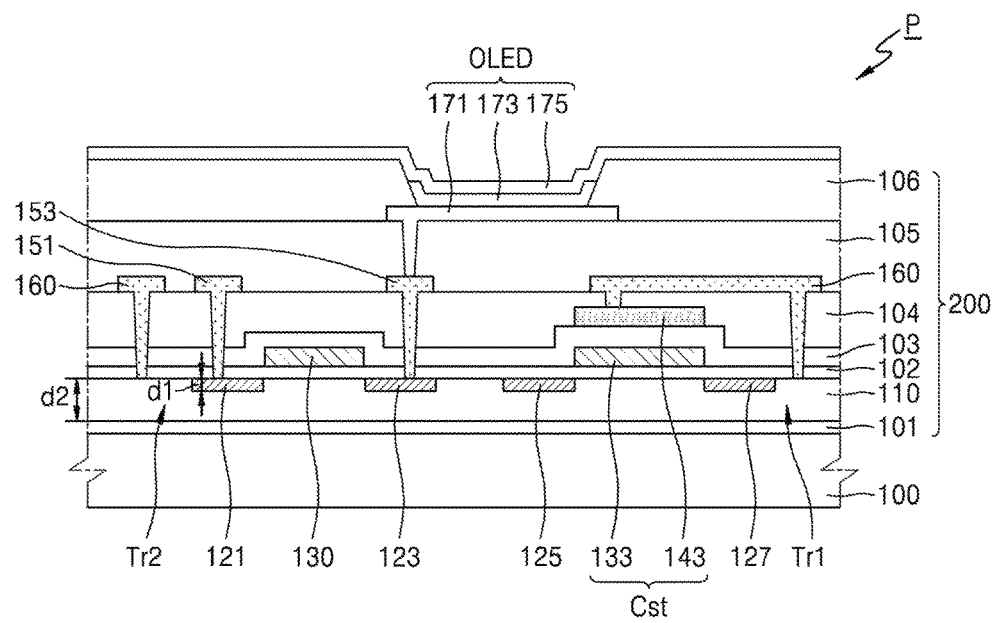
FIG. 2 is a cross-sectional view schematically illustrating a pixel area of a display apparatus fabricated according to an exemplary embodiment of the present inventive concept.

FIG. 2 is a cross-sectional view schematically illustrating the pixel area P of the display apparatus 1 according to one exemplary embodiment of the present inventive concept.

Referring to FIG. 2, the display apparatus 1 according to one exemplary embodiment includes a substrate 100 and a pixel circuit 200 including a storage capacitor Cst and a plurality of thin film transistors Tr1 and Tr2 which are disposed in the pixel area P of the substrate 100. As illustrated in FIG. 2, one of the thin film transistors Tr1 and Tr2 may correspond to the driving thin film transistor T1, and the other one of the thin film transistors Tr1 and Tr2 may correspond to at least one of the switching thin film transistors T2 through T7.

The substrate 100 may include a glass material, a metal material, or a plastic material such as polyethylene terephthalate (PET), polyethylene naphthalate (PEN), and polyimide. Before a semiconductor layer 110 is formed on the substrate 100, a buffer layer 101 may be formed on the substrate 100 to prevent the permeation of impurities from the substrate 100 into the semiconductor layer 110. The buffer layer 101 may include a single layer or a multilayer which includes an insulation material such as silicon oxide and silicon nitride.

The thin film transistor Tr2, which is one of the plurality of thin film transistors Tr1 and Tr2, may include the semiconductor layer 110, a source area 121, a drain area 123, and a gate electrode 130, and the thin film transistor Tr1, which is the other one of the plurality of thin film transistors Tr1 and Tr2, may include the semiconductor layer 110, a source area 125, a drain area 127, and a first electrode 133 of a storage capacitor Cst. For the brief explanation purpose, the thin film transistor Tr2, which is one of the plurality of thin film transistors Tr1 and Tr2, will be explained hereinafter.

The semiconductor layer 110 may be disposed on the substrate 100. The semiconductor layer 110 may include amorphous silicon or polysilicon. Here, the polysilicon may be formed by crystalizing the amorphous silicon. A method of crystalizing the amorphous silicon may include various methods such as a rapid thermal annealing (RTA) method, a solid phase crystallization (SPC) method, an excimer laser annealing (ELA) method, a metal induced crystallization (MIC) method, a metal induced lateral crystallization (MILC) method, and a sequential lateral solidification (SLS) method.

The semiconductor layer 110 may include a first ion impurity and may be formed on the entire substrate 100. The first ion impurity may include one ion impurity among group III ions and group V ions. A conductivity type of the semiconductor layer 110 may be determined according to the first ion impurity. In detail, when the first ion impurity is the group III ion, the semiconductor layer 110 may be a p-type conductive semiconductor. When the first ion impurity is the group V ion, the semiconductor layer 110 may be an N-type conductor semiconductor.

The source area 121 and the drain area 123 may be disposed at opposite sides of the gate electrode 130 on the semiconductor layer 110 and may have a depth d1 from a surface of the semiconductor layer 110. The first depth d1 may be smaller than a thickness d2 of the semiconductor layer 110. The source area 121 and the drain area 123 may include a second ion impurity having a different conductivity type from the first ion impurity. When the first ion impurity is the group III ion, the second ion impurity may be the group V ion. In other words, When the first ion impurity is the group III ion, the semiconductor layer 110 may be formed as the P-type conductive semiconductor, and the source area 121 and the drain area 123 may be doped with the group V ion impurity to form the N-type conductive semiconductor. In another exemplary embodiment, the semiconductor layer 110 may be the N-type conductive semiconductor, and the source area 121 and the drain area 123 may be the P-type conductive semiconductor.

The gate electrode 130 may be disposed between the source area 121 and the drain area 123 on the substrate 110. Considering adhesiveness with an adjacent layer, surface flatness of a stack layer, and workability, the gate electrode 130 may be a single layer or a multilayer including at least one material or an alloy among aluminum (Al), platinum (Pt), palladium (Pd), silver (Ag), magnesium (Mg), gold (Au), Nickel (Ni), Neodymium (Nd), iridium (Jr), chromium (Cr), lithium (Li), calcium (Ca), molybdenum (Mo), titanium (Ti), tungsten (W), and Copper (Cu), for example.

The source area 121 and the drain area 123 may function as a source electrode and a drain electrode, respectively. The source area 121 and the drain area 123 are electrically connected to a signal input electrode 151 and a signal output electrode 153. The source area 121 and the drain area 123 receive and output a signal through a corresponding one of the signal input electrode 151 and the signal output electrode 153.

Meanwhile, the storage capacitor Cst may include the first electrode 133, a dielectric layer 103, and a second electrode 143. The storage capacitor Cst may be disposed to overlap the thin film transistor Tr1 of the plurality of thin film transistors Tr1 and tr2 and may increase a usage efficiency of a space below the organic light emitting diode OLED.

The first electrode 133 of the storage capacitor Cst may function as a gate electrode of the thin film transistor Tr1. The first electrode 133 of the storage capacitor Cst may include the same material as the gate electrode 130 of the switching thin film transistor Tr2 and may be disposed on the same layer as the gate electrode 130 of the switching thin film transistor Tr2. The first electrode 133 of the storage capacitor Cst may include at least one selected from a group consisting of molybdenum (Mo), aluminum (Al), platinum (Pt), palladium (Pd), silver (Ag), magnesium (Mg), gold (Au), Nickel (Ni), Neodymium (Nd), iridium (Jr), chromium (Cr), calcium (Ca), titanium (Ti), tungsten (W), and Copper (Cu).

The dielectric layer 103 of the storage capacitor Cst may include an inorganic compound such as silicon dioxide ($SiO_2$), silicon nitride (SiNx), silicon nitride oxide (SiON), aluminum oxide ($Al_2O_3$), titanium dioxide ($TiO_2$), Tantalum oxide ($Ta_2O_3$), hafnium dioxide ($HfO_2$), zirconium dioxide ($ZrO_2$), barium strontium titanate (BST), and lead zirconate titanate (PZT). The dielectric layer 103 may be disposed on the same layer as a second insulation layer 103, which is disposed on the gate electrode 130 of the thin film transistor Tr2, and may include the same material as the second insulation layer 103.

The second electrode 143 of the storage capacitor Cst may be disposed to overlap the first electrode 133 of the storage capacitor Cst and may be disposed on a lower layer than the top stacking portions of the signal input electrode 151 and the signal output electrode 153. If the second electrode 143 of the storage capacitor Cst is disposed on the same layer as the signal input electrode 151 and the signal output electrode 153, a third insulation layer 104 needs to be disposed as an interlayer insulation layer between the first electrode 133 and the second electrode 143 of the storage capacitor Cst. The third insulation layer 104 may have a thickness greater than about 4000 Å to insulate wirings and thin film transistors from each other. Since the third insulation layer 104 is formed relatively thick, there may not be enough capacitance for the first electrode 133 and the second electrode 143 if the third insulation layer 104 is formed between the first electrode 133 and the second electrode 143.

However, according to the present embodiment, since the second electrode 143 of the storage capacitor Cst may be disposed at a lower layer level than the top stacking portions of the signal input electrode 151 and the signal output 153, a distance between the first electrode 133 and the second electrode 143 becomes relatively short in order to provide a sufficient capacitance for the storage capacitor Cst.

The second electrode 143 of the storage capacitor Cst may include a material, such as indium tin oxide (ITO), or at least one selected from a group consisting of molybdenum (Mo), aluminum (Al), platinum (Pt), palladium (Pd), silver (Ag), magnesium (Mg), gold (Au), nickel (Ni), neodymium (Nd), iridium (Jr), chromium (Cr), calcium (Ca), titanium (Ti), tungsten (W), and Copper (Cu).

A bias wiring 160 is electrically connected to the semiconductor layer 110 and applies a bias voltage to the semiconductor layer 110. The bias wiring 160 may be connected to a portion of an area of the semiconductor layer 110 which overlaps the source area 121 and the drain area 123. According to another exemplary embodiment, since a predetermined voltage is applied to the semiconductor layer 110 through the bias wiring 160, a floating state of the semiconductor layer 110 may be removed and thus a threshold voltage Vth and an off current may be minimized.

The bias wiring 160 may uniformly apply the bias voltage to the semiconductor layer 110 through one or more contact points. The contact points of the bias wiring 160 may be disposed adjacent to at least one of the plurality of thin film transistors Tr1 and Tr2. According to one exemplary embodiment, the bias wiring 160 may contact a portion of the area of the semiconductor layer 110 which is disposed adjacent to the source area 125 and the drain area 127 of the driving thin film transistor Tr1. According to another exemplary embodiment, the bias wiring 160 may contact a portion of the area of semiconductor layer 110 which is disposed adjacent to the source area 121 and the drain area 123 of the switching thin film transistor Tr2. According to another exemplary embodiment, the bias wiring 160 may contact a portion of the area of the semiconductor layer 110 which is disposed adjacent to the source areas 121 and 125 and the drain areas 123 and 127 of the driving thin film transistor Tr1 and the switching thin film transistor Tr2.

According to one exemplary embodiment, the bias wiring 160 may be supplied with the same voltage as a voltage applied to the second electrode 143 of the storage capacitor Cst.

The bias wiring 160 may include the same material as the signal input electrode 151 and the signal output electrode 153 and may be disposed on the same layer as the signal input electrode 151 and the signal output electrode 153. For example, the signal input electrode 151, the signal output electrode 153, and the bias wiring 160 may include a single layer or a multilayer including one or more metals among aluminum (Al), platinum (Pt), palladium (Pd), silver (Ag), magnesium (Mg), gold (Au), nickel (Ni), neodymium (Nd), iridium (Jr), chromium (Cr), lithium (Li), calcium (Ca), molybdenum (Mo), titanium (Ti), tungsten (W), and Copper (Cu).

Hereinafter, a manufacturing method of the display apparatus 1 according to one exemplary embodiment of the present inventive concept will be explained with reference to FIGS. 3 through 8.

Figure 6:
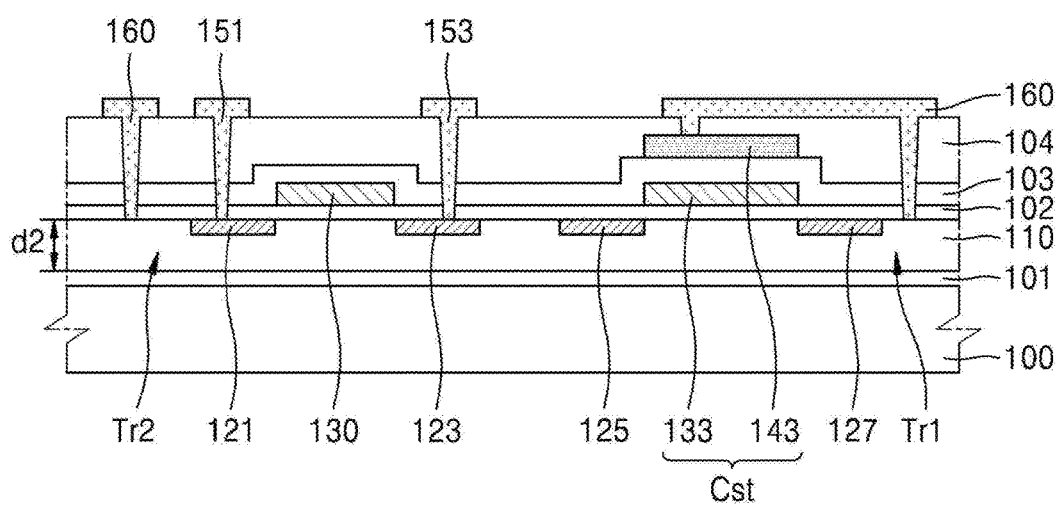
FIG. 6 is a cross-sectional view illustrating the method of manufacturing the display apparatus of FIG. 2, in particular, a process of forming bias wiring and source and drain electrodes.
Figure 7:
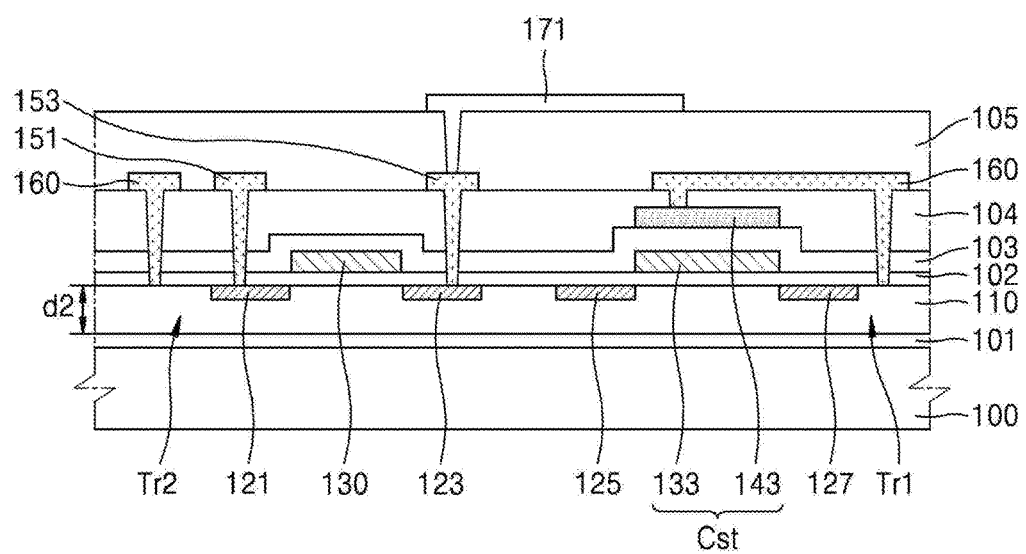
FIG. 7 is a cross-sectional view illustrating the method of manufacturing the display apparatus of FIG. 2, in particular, a process of forming a pixel electrode.
Figure 8:
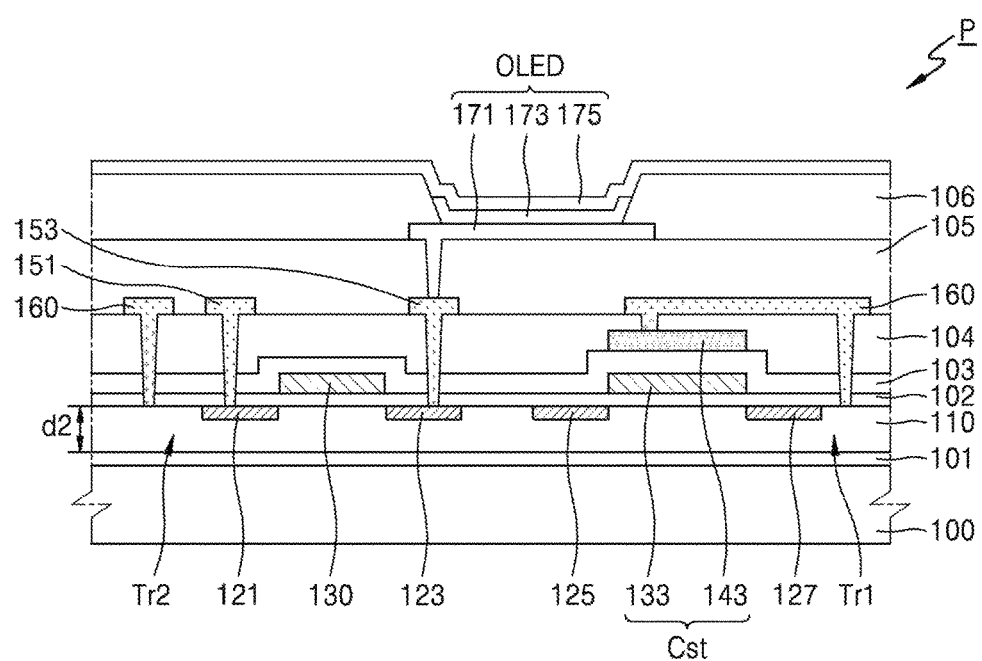
FIG. 8 is a cross-sectional view illustrating the method of manufacturing the display apparatus of FIG. 2, in particular, a process of forming an OLED.

FIGS. 3 through 7 are cross-sectional views illustrating operations of the manufacturing method of the display apparatus 1 according to one exemplary embodiment of the present inventive concept, and FIG. 8 is a cross-sectional view schematically illustrating the display apparatus 1 according to one exemplary embodiment of the present inventive concept.

Figure 3:
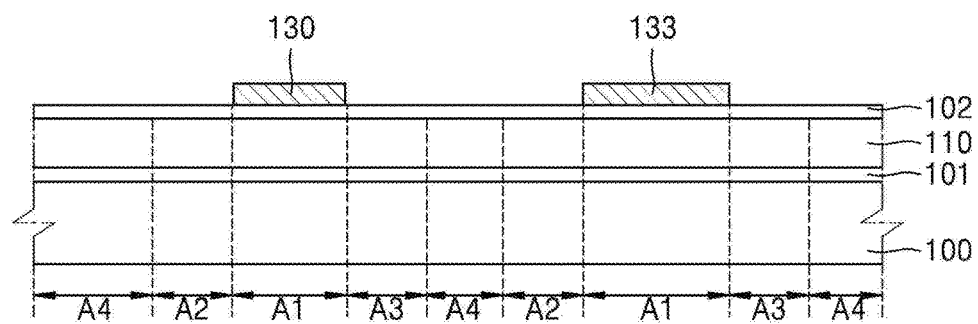
FIG. 3 is a cross-sectional view illustrating a method of manufacturing the display apparatus of FIG. 2, in particular, a process of forming semiconductor layer and gate electrodes.

Referring to FIG. 3, the semiconductor layer 110 is formed on the substrate 100 and includes the first ion impurity.

The semiconductor layer 110 may be formed on the entire substrate 100. According to one embodiment of the present inventive concept, since the semiconductor layer 110 is formed on the entire substrate 100 without patterning, a photolithographing process of patterning the semiconductor layer 110 may not be performed during formation of the semiconductor layer 110. According to one exemplary embodiment of the present inventive concept, the manufacturing method of the display apparatus 1 may be employed to enable manufacture the display apparatus 1 without a mask process.

Thereafter, a first insulation layer 102 is formed on the semiconductor layer 110, and then the gate electrode 130 is formed on the second insulation layer 102.

The first insulation layer 102 may be formed to cover the entire semiconductor layer 110, and may include an insulation organic compound or an insulation inorganic compound such as silicon oxide or silicon nitride. The gate electrode 130 may be formed by forming a metal layer (not illustrated) on the first insulation layer 102 and patterning the formed metal layer. Also, the first electrode 133 of the storage capacitor Cst may be simultaneously formed when the gate electrode 130 is formed.

The semiconductor layer 110 may include a first area A1 corresponding to the gate electrode 130, a second area A2 and a third area A3 which are disposed at opposite sides of the first area A1, and a peripheral area A4 surrounding the first, second, and third areas A1, A2, and A3. As described above, since the first electrode 133 of the storage capacitor Cst functions as the gate electrode 130 of the driving thin film transistor Tr1, the first through third areas A1 through A3 and the peripheral area A4 may also be formed in the semiconductor layer 110 which is disposed below the first electrode 133 of the storage capacitor Cst.

Figure 4:
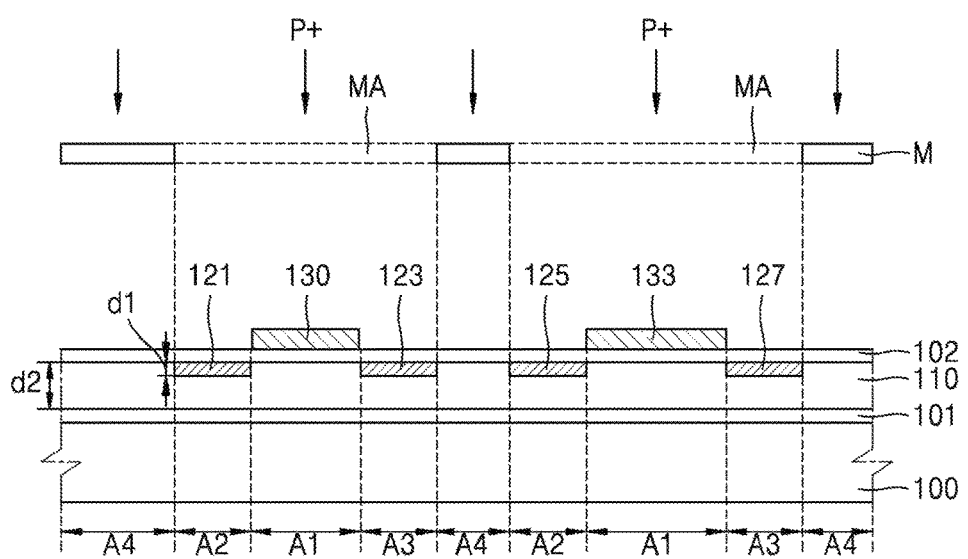
FIG. 4 is a cross-sectional view illustrating the method of manufacturing the display apparatus of FIG. 2, in particular, a process of forming source and drain regions of the semiconductor layer using photolithography.

Referring to FIG. 4, the source area 121 and 125 and the drain areas 123 and 127 are formed on the semiconductor layer 110.

The source area 121 and 125 and the drain areas 123 and 127 may have the first depth d1, include the second ion impurity, and be disposed on both opposite sides of the gate electrode 130. The source area 121 and 125 and the drain areas 123 and 127 may be formed by doping the semiconductor layer 110 with the second ion impurity by using a first mask M and the gate electrodes 130 and 133. The first mask M covers the peripheral area A4 and may include openings MA corresponding to the first area A1, the second area A2, and the third area A3. The first mask M may be a photomask to form a semiconductor pattern. Generally, the semiconductor pattern includes a source area, a drain area, and an active area and is patterned by using a photolithographic process before forming a gate electrode. The first mask M may have the same pattern as the above-described photomask. According to the present embodiment, after the gate electrode 130 and the first electrode 133 of the storage capacitor Cst are formed, the source areas 121 and 125 and the drain areas 123 and 127 may be formed by using the first mask M.

According to the present embodiment, after the openings MA of the first mask M are arranged to correspond to the first, second, and third areas A1, A2, and A3 of the semiconductor layer 110, the semiconductor layer 110 is doped with the second ion impurity. Here, the first mask M, the gate electrode 130, and the first electrode 133 of the storage capacitor Cst function as a mask. Accordingly, the second area A2 and the third area A3 of the semiconductor layer 110 may be doped with the second ion impurity except the first area A1 of the semiconductor layer 110, which corresponds to the gate electrode 130 and the first electrode 133, and the peripheral area A4, which is blocked by the first mask M. According to the present embodiment, a doping amount of the second ion impurity may be controlled so that the source area 121 and the drain area 123 have the first depth d1.

One of the second area A2 and the third area A3, which are doped with the second ion impurity, may be the source area 121, and the other one of the second area A2 and the third area A3 may be the drain area 123. Although FIG. 2 illustrates the second area A2 as the source area 121 and the third area A3 as the drain area 123, the present inventive concept is not limited thereto. As described above, the manufacturing method of the display apparatus 1 according to one exemplary embodiment of the present inventive concept may provide advantages such as the manufacturing method does not need an additional mask and a mask pattern change.

Figure 5:
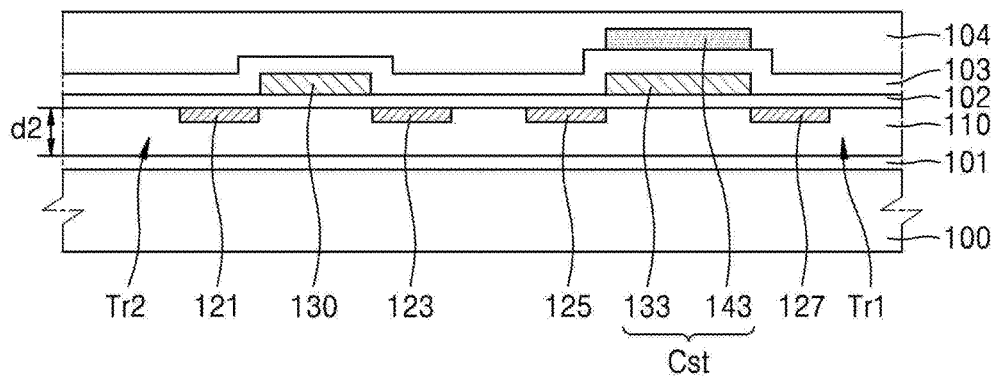
FIG. 5 is a cross-sectional view illustrating the method of manufacturing the display apparatus of FIG. 2, in particular, a process of forming a capacitor electrode.

Referring to FIG. 5, after the second insulation layer 103 is formed, the second electrode 143 of the storage capacitor Cst is formed.

The second insulation layer 103 may cover the gate electrode 130 and the first electrode 133 of the storage capacitor Cst. As stated above, the second insulation layer 103 may function as the dielectric layer of the storage capacitor Cst. The second insulation layer 103 may include an inorganic compound such as silicon dioxide ($SiO_2$), silicon nitride (SiNx), silicon nitride oxide (SiON), aluminum oxide ($Al_2O_3$), titanium dioxide ($TiO_2$), Tantalum oxide ($Ta_2O_3$), hafnium dioxide ($HfO_2$), zirconium dioxide ($ZrO_2$), barium strontium titanate (BST), and lead zirconate titanate (PZT).

Thereafter, a second metal layer (not illustrated) is formed on the second insulation layer 103, and then the second metal layer is patterned to form the second electrode 143 of the storage capacitor Cst. The second electrode 143 may be disposed to overlap the first electrode 133. The second electrode 143 may include the same material as the first electrode 133. For example, the second electrode 143 may include a single layer or a multilayer including one or more material or an alloy among aluminum (Al), platinum (Pt), palladium (Pd), silver (Ag), magnesium (Mg), gold (Au), nickel (Ni), neodymium (Nd), iridium (Jr), chromium (Cr), lithium (Li), calcium (Ca), molybdenum (Mo), titanium (Ti), tungsten (W), and Copper (Cu).

Referring to FIGS. 5 and 6, after the third insulation layer 104 is formed on the second electrode 143, the signal input electrode 151, the signal output electrode 153, and the bias wiring 160 are formed.

The third insulation layer 104 may be formed to cover the second electrode 143 and the second insulation layer 103. The third insulation layer 104 may include an inorganic compound such as silicon dioxide ($SiO_2$), silicon nitride (SiNx), silicon nitride oxide (SiON), aluminum oxide ($Al_2O_3$), titanium dioxide ($TiO_2$), Tantalum oxide ($Ta_2O_3$), hafnium dioxide ($HfO_2$), zirconium dioxide ($ZrO_2$), barium strontium titanate (BST), and lead zirconate titanate (PZT).

Thereafter, contact holes are formed in the first, second, and third insulation layers 102, 103, and 104 to expose portions of the source area 121, the drain area 123, and the peripheral area A4, and then a third metal layer (not illustrated) is filled into the contact holes and stacked on the contact holes, and the third insulation layer 104 and is patterned. According to the patterning process, the signal input electrode 151 is formed to be electrically connected to one of the source area 121 and the drain area 123 and the signal output electrode 153 is also formed to be electrically connected to the other one of the source area 121 and the drain area 123. Although FIG. 6 illustrates the signal input electrode 151 to be connected to the source area 121 and the signal output electrode 153 to be connected to the drain area 123, the present inventive concept is not limited thereto. According to a kind of the semiconductor, a wiring connected to a source area may be a signal output electrode, and a wiring connected to a drain area may be a signal input electrode.

When the signal input electrode 151 and the signal output electrode 153 are formed, the bias wiring 160 may be simultaneously formed to be electrically connected to the peripheral area A4 of the semiconductor layer 110.

Since the bias wiring 160 is connected to the peripheral area A4, the source areas 121 and 125 and the drain areas 13 and 127 may be non-overlapping with each other. The bias wiring 160 may apply a predetermined bias voltage to the peripheral area A4 of the semiconductor layer 110.

As an comparative example, when a voltage is not applied to the semiconductor layer 110, that is, when the semiconductor layer 110 is in a floating state, a coupling influence occurring at a source electrode and a drain electrode may cause a change of a threshold voltage Vth of a thin film transistor and occurrence of an off current change of the thin film transistor, according to fluctuation of a gate voltage. In this case, the thin film transistor may not output a constant voltage but will instead generate a white spot or a black spot.

However, according to the present embodiment, a predetermined bias voltage is applied to the peripheral area A4 of the semiconductor layer 110 through the bias wiring 160 so that changes in the threshold voltage and the off current may be reduced.

The bias voltage of the bias wiring 160 may be the same voltage as a voltage applied to the second electrode 143 of the storage capacitor Cst.

Referring to FIG. 7, the fourth insulation layer 105 is formed as a planarization layer on the signal input electrode 151, the signal output electrode 153, and the bias wiring 160. The fourth insulation layer 105 may include a pixel electrode 171. The pixel electrode 171 may be connected to the signal output electrode 153 through a contact hole which is formed in the fourth insulation layer 105.

The pixel electrode 171 may include one or more selected from a group consisting of indium tin oxide (ITO), indium zinc oxide (IZO), zinc oxide (ZnO), indium oxide ($In_2O_3$), indium gallium oxide (IGO), and aluminum zinc oxide (AZO). The pixel electrode 171 may be a three layer structure including a transparent conductive oxide layer/a semitransparent metal layer/a transparent conductive oxide layer.

Referring to FIG. 8, the fifth insulation layer 106 is formed on the pixel electrode 171, and the organic light emitting diode OLED is formed on the fifth insulation layer 106. The organic light emitting diode OLED is disposed at a position corresponding to the pixel electrode 171 and may include an intermediate layer 173 and an opposite electrode 175.

The intermediate layer 173 may include an organic light emitting element to emit light of red, green, or blue. The organic light emitting element may include a low molecule organic compound or a polymer organic compound. When the organic light emitting element includes a low molecule organic layer including the low molecule organic compound, a hole transport layer (HTL) and a hole injection layer (HIL) are disposed in a direction toward the pixel electrode 171, and an electron transport layer (ETL) and an electron injection layer (EIL) are disposed in a direction toward the opposite electrode 175, with respect to the organic light emitting layer. It is possible that various layers may be stacked in the organic light emitting element in addition to the hole transport layer (HTL), the hole injection layer (HIL), the electron transport layer (ETL), and the electron injection layer (EIL).

The opposite electrode 175 is disposed on the intermediate layer 173 to correspond to the pixel electrode 171. The opposite electrode 175 may include a transparent electrode or a reflective electrode. When the opposite electrode 175 includes the transparent electrode, the opposite electrode 175 may include a transparent conductive oxide, such as indium tin oxide (ITO), indium zinc oxide (IZO), and indium tin zinc oxide (ITZO), or the opposite electrode 175 may include a multilayer having a metal layer, such as lithium (Li), calcium (Ca), lithium fluoride/calcium (LiF/Ca), lithium fluoride/aluminum (LiF/Al), aluminum (Al), silver (Ag), and magnesium (Mg) or a compound thereof, and the transparent conductive oxide, such as indium tin oxide (ITO), indium zinc oxide (IZO), and indium tin zinc oxide (ITZO). When the opposite electrode 175 includes the reflective electrode, the opposite electrode includes lithium (Li), calcium (Ca), lithium fluoride/calcium (LiF/Ca), lithium fluoride/aluminum (LiF/Al), aluminum (Al), silver (Ag), magnesium (Mg), or a compound thereof. However, the present inventive concept is not limited thereto. The pixel electrode 171 and the opposite electrode 175 may include an organic compound such as conductive polymer.

As described above, according to one exemplary embodiment, the display apparatus 1 may remove a floating state of the semiconductor layer 110 and minimize changes of the threshold voltage Vth and the off current by applying the bias voltage to the peripheral area A4 except to the source area 121 and the drain area 123. And, the manufacturing method of the display apparatus 1 may be used in order to manufacture the display apparatus 1 without an additional mask process and a mask structure change by forming the semiconductor layer 110 on the entire substrate 100 and then forming the source area 121 and the drain area 123.

Although the above-described embodiments show an organic light emitting display apparatus, the present inventive concept is not limited thereto. The display apparatus in the present disclosure may be referred to as a liquid crystal display apparatus or a flexible display apparatus which includes a thin film transistor.

It should be understood that exemplary embodiments described herein should be considered in a descriptive sense only and not for purposes of limitation. Descriptions of features or aspects within each exemplary embodiment should typically be considered as available for other similar features or aspects in other exemplary embodiments.

While one or more exemplary embodiments have been described with reference to the figures, it will be understood by those of ordinary skill in the art that various changes in form and details may be made therein without departing from the spirit and scope as defined by the following claims.

What is claimed is:

1. A display apparatus comprising:
a substrate having a plurality of pixel areas; and
a pixel circuit comprising a storage capacitor and a plurality of thin film transistors (TFTs) which are disposed in each pixel area, wherein at least one of the plurality of TFTs comprises:
a semiconductor layer disposed on the substrate and comprising a first ion impurity;
a source area and a drain area, which are spaced apart from each other, having a first depth from a surface of the semiconductor layer, and comprising a second ion impurity;
a gate electrode disposed on the semiconductor layer between the source area and the drain area; and
a bias wiring forming a direct connection to the semiconductor layer outside of the source area, the drain area, and a channel area between the source area and the drain area.

2. The display apparatus of claim 1, wherein the first ion impurity and the second ion impurity are different conductive ion impurities.

3. The display apparatus of claim 1, wherein the first depth is smaller than a thickness of the semiconductor layer.

4. The display apparatus of claim 1, further comprising:
a signal input electrode connected to one of the source area and the drain area; and
a signal output electrode connected to the other one of the source area and the drain area,
wherein the bias wiring is disposed on the same layer as the signal input electrode and the signal output electrode.

5. The display apparatus of claim 1, wherein the bias wiring does not overlap with the source area and the drain area.

6. The display apparatus of claim 1, wherein:
the storage capacitor comprises a first electrode, a dielectric layer, and a second electrode; and
the first electrode is disposed on the same layer as the gate electrode and comprises a same material as the gate electrode.

7. The display apparatus of claim 6, wherein the first electrode is the gate electrode of one TFT of the plurality of TFTs.

8. The display apparatus of claim 6, wherein the bias wiring applies a same voltage to the semiconductor layer, as a voltage applied to the second electrode.

9. The display apparatus of claim 1, wherein the semiconductor layer is disposed on the entire substrate.

10. A display apparatus comprising:
a substrate having a plurality of pixel areas; and
a pixel circuit comprising a storage capacitor and a plurality of thin film transistors (TFTs) which are disposed in each pixel area,
wherein at least one of the plurality of TFTs comprises:
a semiconductor layer disposed on the substrate and comprising a first ion impurity;
a source area and a drain area, which are spaced apart from each other, having a first depth from a surface of the semiconductor layer, and comprising a second ion impurity;
a gate electrode disposed on the semiconductor layer between the source area and the drain area; and
a bias wiring forming a direct connection to the semiconductor layer outside of the source area, the drain area, and a channel area between the source area and the drain area.

* * * * *